United States Patent [19]
Fukui et al.

[11] Patent Number: 5,400,270
[45] Date of Patent: Mar. 21, 1995

[54] SIMULATOR FOR CONDUCTING TIMING ANALYSIS OF A CIRCUIT

[75] Inventors: Yoshiaki Fukui; Norio Yoshida; Yasunori Kishimoto; Yoshio Inoue, all of Itami, Japan

[73] Assignee: Mitsubishi Denki Kabushiki Kaisha, Tokyo, Japan

[21] Appl. No.: 933,711

[22] Filed: Aug. 24, 1992

[30] Foreign Application Priority Data

Aug. 30, 1991 [JP] Japan .................................. 3-219459
Apr. 23, 1992 [JP] Japan .................................. 4-104251

[51] Int. Cl.⁶ ............................................ G06F 15/60
[52] U.S. Cl. ................................... 364/578; 364/488
[58] Field of Search ............... 364/578, 488, 489, 490, 364/569; 371/23, 21.2

[56] References Cited
U.S. PATENT DOCUMENTS

| | | | |
|---|---|---|---|
| T928,004 | 11/1974 | Carpenter et al. | 364/489 |
| T940,013 | 11/1975 | Ho | 364/489 |
| 4,821,220 | 4/1989 | Duisberg | 364/578 |
| 4,924,430 | 5/1990 | Zasio et al. | 364/488 |
| 5,105,374 | 4/1992 | Yoshida | 364/578 |
| 5,189,365 | 2/1993 | Ikoda et al. | 364/578 |

OTHER PUBLICATIONS

Mitsubishi Electric Corporation, Oct. 8, 1990, pp. 53–60, Tetsuya Okabe, et al., "A Mixed Level Simulator with Enhanced Timing Verification Capability."

Primary Examiner—Ellis B. Ramirez
Attorney, Agent, or Firm—Oblon, Spivak, McClelland, Maier & Neustadt

[57] ABSTRACT

There is disclosed a simulator having timing error detecting from input and output signal level changes. Different timing error verifications are carried out for respective elements. In similar constructions, different test rule error verifications are also carried out for the respective elements as a function of the contents of a test rule check value definition file.

20 Claims, 19 Drawing Sheets

FIG. 4

| TIMING CHECK ELEMENT NAME | TIMING ERROR TYPE | CHECK VALUE |
|---|---|---|
| FF1 | SETUP | A1 |
| FF1 | HOLD | B1 |
| FF2 | SPIKE | C1 |
| ⋮ | ⋮ | ⋮ |

FIG. 5

| TIMING CHECK ELEMENT NAME | TIMING ERROR TYPE | CHECK VALUE |
|---|---|---|
| FF1 | SETUP | A1 |
| FF1 | SETUP | A2 |
| FF2 | ⋮ | ⋮ |
| ⋮ | | |

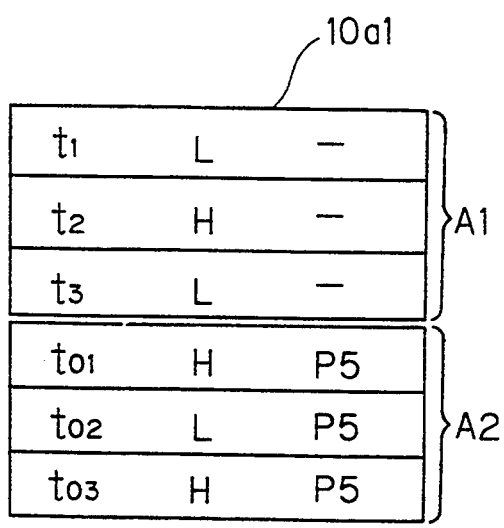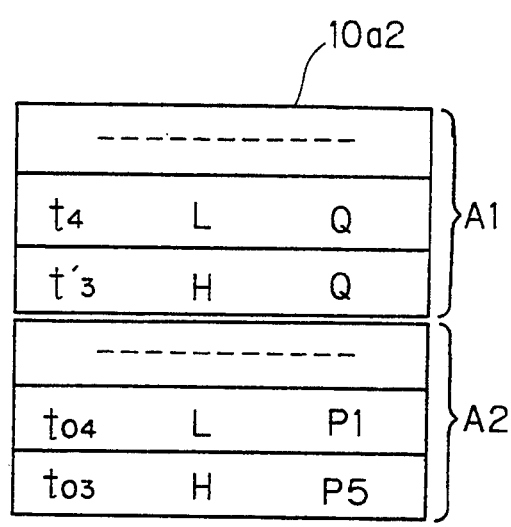

FIG. 12

| TEST RULE CHECK ELEMENT NAME | CHECK ITEM | CHECK VALUE |
|---|---|---|
| T1 | DEAD ZONE | 10(ns) |
| ⋮ | ⋮ | ⋮ |

FIG. 13

| TEST RULE CHECK ELEMENT NAME | CHECK ITEM | CHECK VALUE |
|---|---|---|
| T2 | MAXIMUM FREQUENCY WIDTH CHECK | 1000 (ns) |
|  | DEAD ZONE | 10 10(ns) |
| ⋮ | ⋮ | ⋮ |

FIG. 14

| TEST RULE CHECK ELEMENT NAME | CHECK ITEM | CHECK VALUE |
|---|---|---|
| T1 | DEAD ZONE | 10(ns) |
| T2 | DEAD ZONE | 10(ns) |
| T1, T2 | NUMBER OF WAVEFORMS | 7 |
| ⋮ | ⋮ | ⋮ |

FIG. 15

| TEST RULE CHECK ELEMENT NAME | CHECK ITEM | CHECK VALUE |
|---|---|---|
| T1 | DEAD ZONE | 10(ns) |
| T1 | DEAD ZONE | 9(ns) |
| T2 | DEAD ZONE | 7(ns) |
| T2 | DEAD ZONE | 6(ns) |
| ⋮ | ⋮ | ⋮ |

| TEST RULE CHECK ELEMENT NAME | CHECK ITEM | CHECK VALUE |
|---|---|---|
| B1,B2,B3 ... Bn | OUTPUT BUFFER SIMULTANEOUS CHANGE NUMBER | 50 |
| ⋮ | ⋮ | ⋮ |

SIMULATOR FOR CONDUCTING TIMING ANALYSIS OF A CIRCUIT

BACKGROUND OF THE INVENTION

1. Field of the Invention

The present invention relates to a simulator for simulating the operation of elements included in a circuit to be simulated while verifying timing errors or test rule errors of the elements.

2. Description of the Background Art

Logic simulators have found wide usage as means for checking logic operations and timing verification in the design of logic circuits. There are simulators only for the timing verification.

FIG. 22 is a flow chart of the timing verification of a conventional simulator. The operation will be described hereinafter with reference to FIG. 22.

In the step S1, an input test pattern signal is inputted to an input terminal of a circuit to be simulated. The outputs of respective elements included in the circuit are calculated, whereby the circuit is simulated. In the step S2, timing errors in the input and output signals of the elements are verified as a function of the simulation results provided in the step S1.

When the timing error is detected in the step S3, the process proceeds to the step S4. In the step S4, an error message list is outputted which is helpful for investigation of causes for the timing error. The error message list includes, for example, the type of timing error, the time at which the error has been caused, the element in which the error has been caused, and the like. When no timing error is detected in the step S3, the process does not proceed to the step S4 but to the step S5.

In the step S5, it is checked whether or not the simulation is completed for all of the elements included in the circuit to be simulated. If an unsimulated element is found, the process returns to the step S1. The operation of the steps S1 to S5 is repeated until the simulation is completed for all of the elements.

The simulator thus executes the timing verification.

The logic simulators are used in a few cases as means for checking logic operations and test rule verification in the design of the logic circuits. The test rule verification is minimized, if executed.

FIG. 23 is a flow chart of the test rule verification of the conventional simulator. The operation will be described below with reference to FIG. 23.

Initially, the input test pattern signal is inputted to the input terminal of the circuit to be simulated in the step S6. The outputs of the respective elements are calculated, whereby the circuit is simulated.

In the step S7, it is checked whether or not the simulation is completed for all of the elements included in the circuit. When an unsimulated element is found, the process returns to the step S6. The operation of the steps S6 and S7 is repeated until the simulation is completed for all of the elements.

When the simulation is completed, test rule errors in the output (and input) signals of the elements are verified in the step S8.

When the test rule error is detected in the step S9, the process proceeds to the step S10. An error message list is outputted in the step S10, which includes the type of test rule error, the element in which the error has been caused, and the like. When no test rule error is detected in the step S9, no error message is outputted and the process is terminated.

The simulator thus executes the test rule verification.

The conventional simulator verifies the timing errors or test rule errors of the elements in the above-mentioned manner to output the timing error message or test rule error message.

The verification contents of the timing errors are however fixed. Only specified timing errors are verified for any element. For example, only a set-up timing error, a spike error and a hazard error are verified where the element is a flip-flop. Check values as an error condition parameter of various types of timing errors are also fixed. There has been a problem that the timing errors of the same type are not verified with different check values.

Similarly, the verification contents of the test rule errors are fixed. Only specified test rule errors are verified (e.g., an Icc leak error, a DC test error, a bus conflict error, and an output buffer simultaneous change number check error). Check values as an error condition parameter of various types of test rule errors are also fixed. There has been a problem that the test rule errors of the same type are not verified with different check values.

SUMMARY OF THE INVENTION

The present invention is intended for simulating an operation of an object circuit having interconnected electronic elements while detecting a timing error in respective operations of the electronic elements, wherein at least one of the electronic elements is a delay element, and the object circuit has a plurality of input terminals to which a given plurality of test pattern signals are applied, respectively, the simulator comprising: (a) memory means having storage areas which are assigned to the electronic elements, respectively, (b) means for providing a timing check definition file specifying contents of the timing errors for the respective elements of the circuit, (c) means for generating an electronic status equivalently representing a situation where the plurality of test pattern signals are applied to the plurality of input terminals of the object circuit, respectively to simulate an operation of the object circuit under the situation, (d) means coupled to the means (a) and (c) for being informed from the means (c) that a level transition is caused on one of outputs of the electronic elements and for writing an information an a storage area which is included in the storage areas and is assigned to an electronic element on whose output the level transition is caused, where the information includes a first component representing contents of the level transition and a second component identifying an input terminal of the object circuit to which a test pattern signal causing the level transition is applied, (e) means coupled to the means (b) and (c) for detecting a timing error on respective inputs and outputs of the electronic elements on the basis of the timing check definition file in a simulation executed by the means (c), (f) means coupled to the means (a) and (c) for referring to the information written in a storage area which is included in the storage areas and is assigned to an electronic element at which the timing error is detected, to identify a test pattern signal which is included in the plurality of test pattern signals and has relation to the timing error, and (g) means coupled to the means (f) for outputting an error message including a first data representing contents of the timing error and a second data identifying the test pattern signal having relation to the timing error.

In another aspect, the present invention is intended for simulating an operation of an object circuit having interconnected electronic elements while detecting a test rule error in respective operations of the electronic elements and the object circuit has a plurality of input terminals to which a given plurality of test pattern signals are applied, respectively, the simulator comprising: (i) means for providing a test rule definition file specifying contents of the test rule errors for the respective elements of the circuit, (j) means for generating an electronic status equivalently representing a situation where the plurality of test pattern signals are applied to the plurality of input terminals of the object circuit, respectively to simulate an operation of the object circuit under the situation, (k) means for detecting a test rule error on respective inputs and outputs of the electronic elements on the basis of the test rule definition file in a simulation executed by the means (j), and (l) means for outputting an error message including a first data representing electronic elements detected in the test rule error and a second data representing contents of the test rule error.

In the simulator of the present invention, the timing error detecting means (e) detects the timing errors of the input and output signals of the respective elements in the circuit as a function of the timing check definition file. Therefore, an operator executing the simulation arbitrarily sets the timing check definition file by means of the timing check definition file providing means, whereby different timing error verifications are carried out for the respective elements in the circuit.

In the simulator of the present invention, the test rule error detecting means (k) detects the test rule errors of the input and output signals of the respective elements in the circuit as a function of the test rule check definition file. Therefore, the operator executing the simulation arbitrarily sets the test rule check definition file by means of the test rule check definition file providing means, whereby different test rule error verifications are carried out for the respective elements in the circuit.

An object of the present invention is to provide a simulator which is capable of executing different timing error verifications or different test rule error verifications for respective elements.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 illustrate timing check value definition files shown in FIG. 1, respectively;

FIG. 8 illustrates information tables;

FIGS. 12 to 16 illustrate test rule check value definition files shown in FIG. 11, respectively;

FIGS. 17 to 19 are circuit diagrams conceptionally showing test rule check primitives, respectively;

DESCRIPTION OF THE PREFERRED EMBODIMENTS

Figure 2:
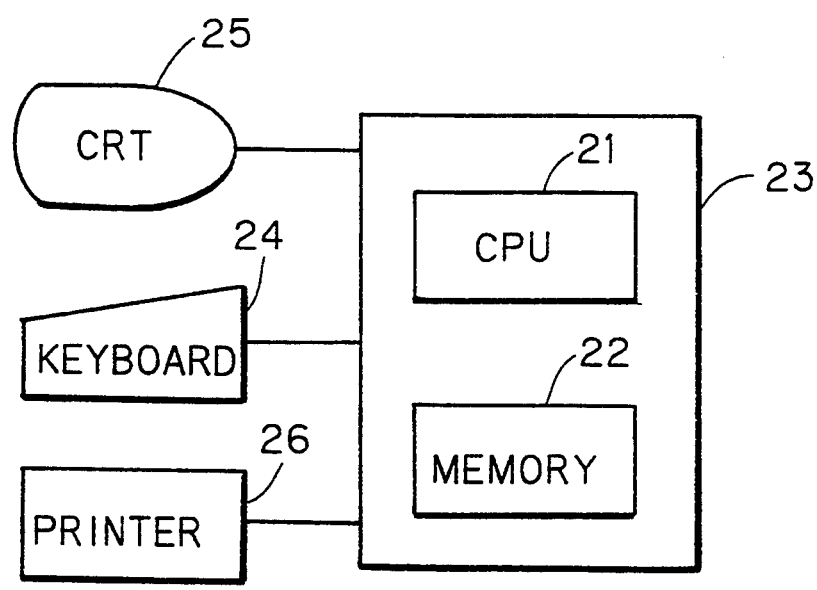
FIG. 2 is a block diagram of a hardware construction of the simulator according to the present invention.

FIG. 2 is a block diagram showing a hardware construction of a simulator of first and second preferred embodiments according to the present invention. The simulator comprises a computer 23 including a CPU 21 and a memory 22, a keyboard 24 for inputting informations to the computer 23, and a CRT 25 and a printer 26 for outputting informations from the computer 23.

Figure 1:
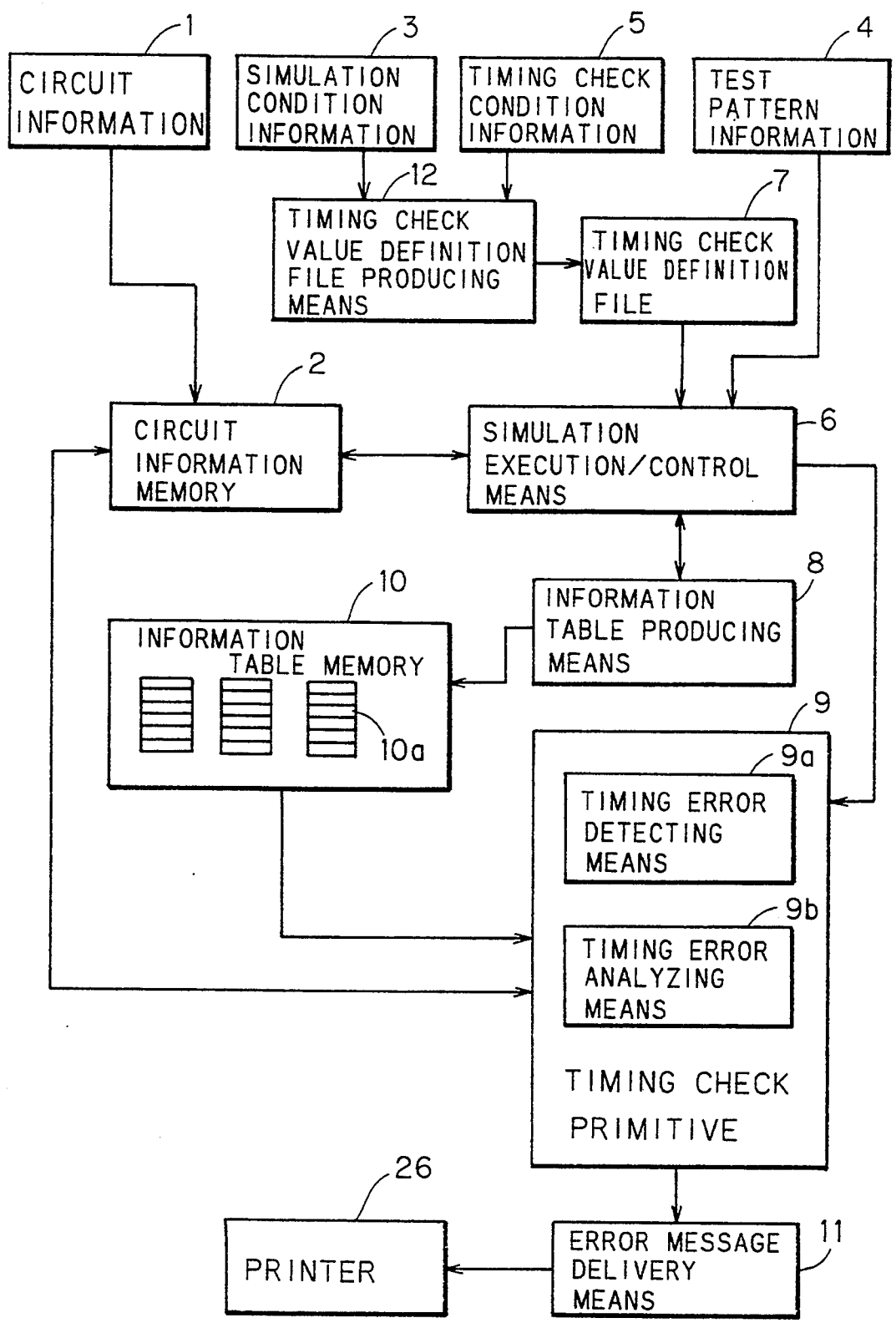
FIG. 1 is a block diagram of a simulator according to a first preferred embodiment of the present invention.

FIG. 1 is a block diagram showing a functional construction of the simulator of the first preferred embodiment.

Figure 3:
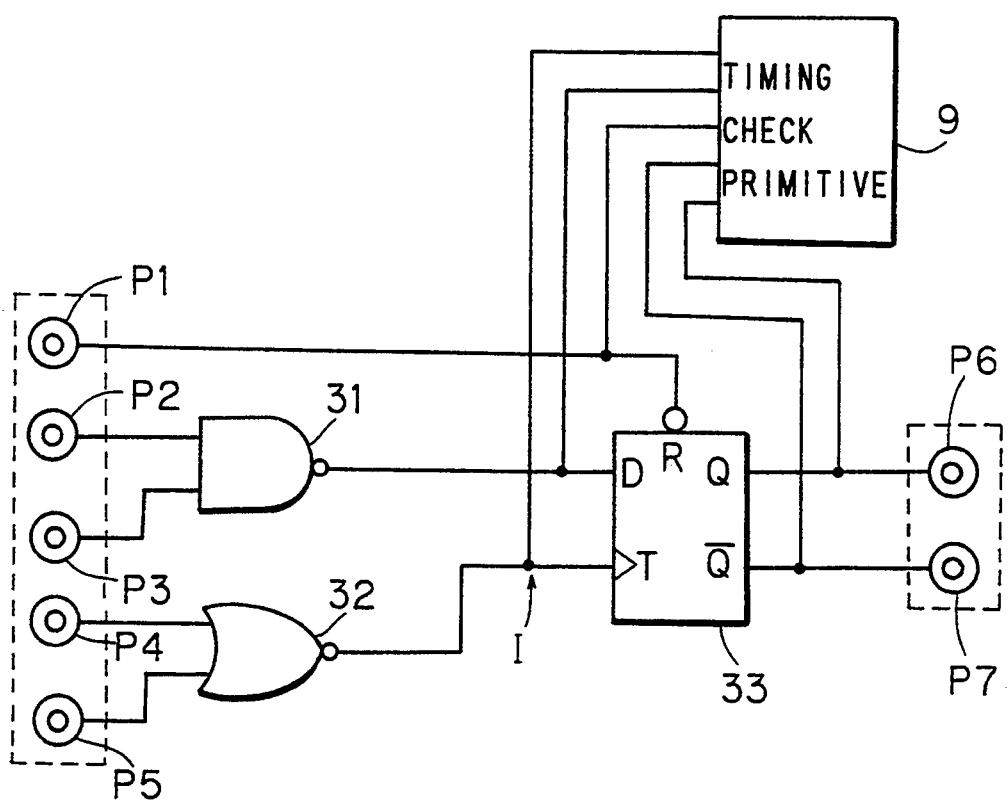
FIGS. 3 and 6 are circuit diagrams conceptionally showing timing check primitives, respectively.

A circuit information 1 having element connections in a circuit to be simulated is read to a circuit information memory 2 from the exterior of the simulator. An example of the circuit to be simulated is shown in FIG. 3. The circuit includes a NAND gate 31, a NOR gate 32 and a D flip-flop 33. Reference characters P1 to P5 designate test pattern input terminals, and P6 and P7 designate output terminals.

A simulation condition information 3 specifying parts of the circuit which are to be simulated and a timing check condition information 5 specifying the contents of a timing error verification of the input and output signals of the respective elements are applied to a timing check value definition file producing means 12. The timing check value definition file producing means 12 produces a timing check value definition file 7 described later in detail as a function of the simulation condition information 3 and timing check condition information 5.

A test pattern information 4 of the input signals to be applied to the input terminals of the circuit and the timing check value definition file 7 are given to a simulation execution/control means 6.

The simulation execution situations of the simulation execution/control means 6 are constantly given to an information table producing means 8 and a timing check primitive 9. Each time a level transition is caused in the output signals of the elements of the circuit due to the production of an event in the elements, the information table producing means 8 writes an information described below to information tables 10a provided in an information table memory 10.

Areas for storage of the information tables 10a are provided in the information table memory 10 in corresponding relation to the respective elements in the circuit. The contents to be written to the information tables 10a are an output value of the element and the time when the signal level has changed by the production of the event in the element, a terminal information indicating to which input terminal in the circuit the test pattern having caused the output change has been applied, a signal level of the test pattern having caused the error, and the time when the input test pattern having caused the level transition event has been applied to the terminal.

A timing error detecting means 9a included in the timing check primitive 9 recognizes, from the simulation execution situations of the simulation execution/control means 6, the input and output signal level changes of the elements provided from the signal level changes of a signal line between the elements, to verify the timing errors with independent contents for each element as a function of the contents of the timing check value definition file 7.

The timing error verification includes, for example, a spike check, a hazard check (or a negative spike check), a relation check (or a timing check between two lines) and a condition check (or a check if a specified signal level change occurs in two input pins of an element or a partial circuit) where the element is a flip-flop.

The timing verification includes a race check and an oscillation check as well as the spike check and hazard check where the element forms a loop circuit.

The spike, hazard and race checks function to check signals inputted to a circuit portion from the exterior thereof. The oscillation check functions to output an error in a circuit having an odd number of elements which output inverted values of the inputs in a loop (e.g., NAND and NOR gates) when all of the elements in the loop are activated.

FIGS. 4 and 5 illustrate parts of the contents of the timing check value definition file 7, respectively. The timing check value definition file 7 includes at least timing check element names, timing error types and check values described therein. Such definition of the timing check value definition file 7 enables the timing error types and check values to be set independently for different flip-flops FF1 and FF2.

Figure 6:
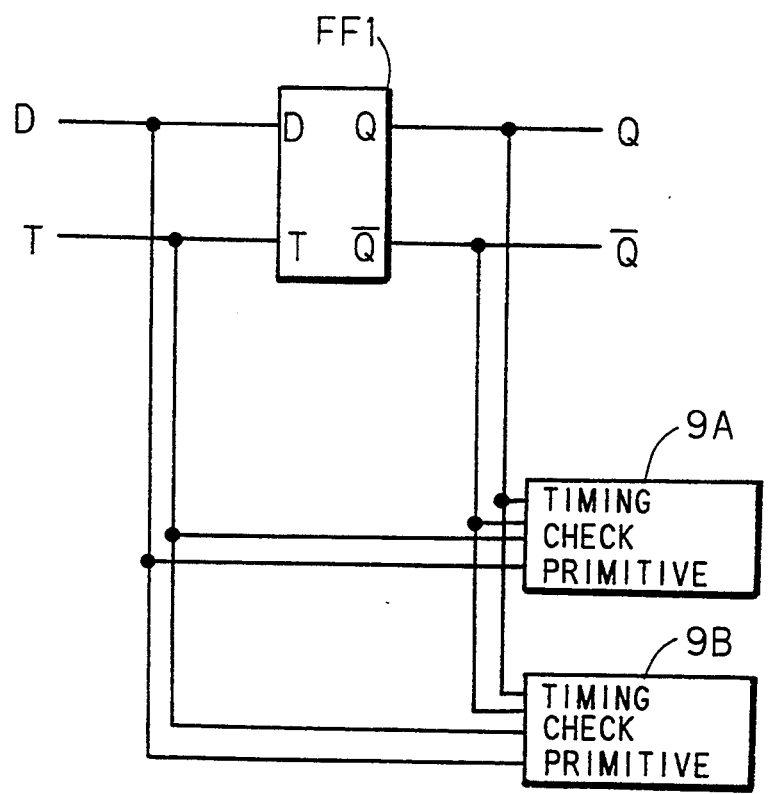

When the flip-flop FF1 is defined twice in the timing check value definition file 7 as shown in FIGS. 4 and 5, the simulation execution/control means 6 produces two timing check primitives 9A and 9B for the one flip-flop FF1 as shown in FIG. 6.

The description of the contents of the timing check value definition file 7 shown in FIG. 4 enables the simultaneous execution of the set-up timing error verification of the flip-flop FF1 by the timing check primitive 9A, and the hold check and the test rule error verification of spike errors by the timing check primitive 9B.

The description of the contents of the timing check value definition file 7 shown in FIG. 5 enables the simultaneous execution, on the flip-flop FF1, of the set-up timing error verification of a check value A1 by the timing check primitive 9A and the set-up timing error verification of a check value A2 by the timing check primitive 9B.

On detection of the foregoing timing error by the timing error detecting means 9a, a timing error analyzing means 9b investigates the cause for the error as a function of the information tables 10a applied to the element to output the result found from the investigation in the form of error messages described below to an error message delivery means 11.

Figure 7:
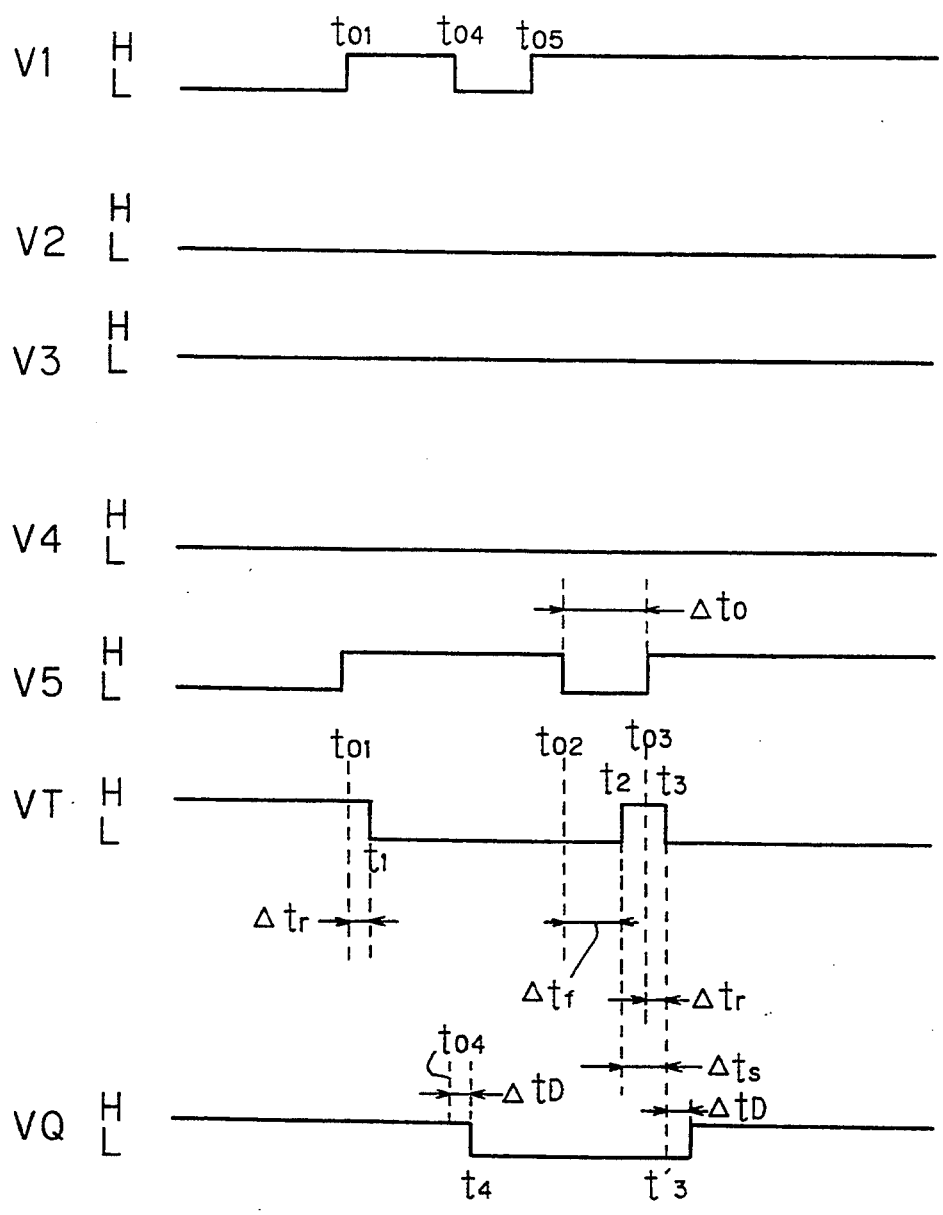
FIG. 7 is a timing chart showing signal level changes in the circuit of FIG. 3.
Figure 9:
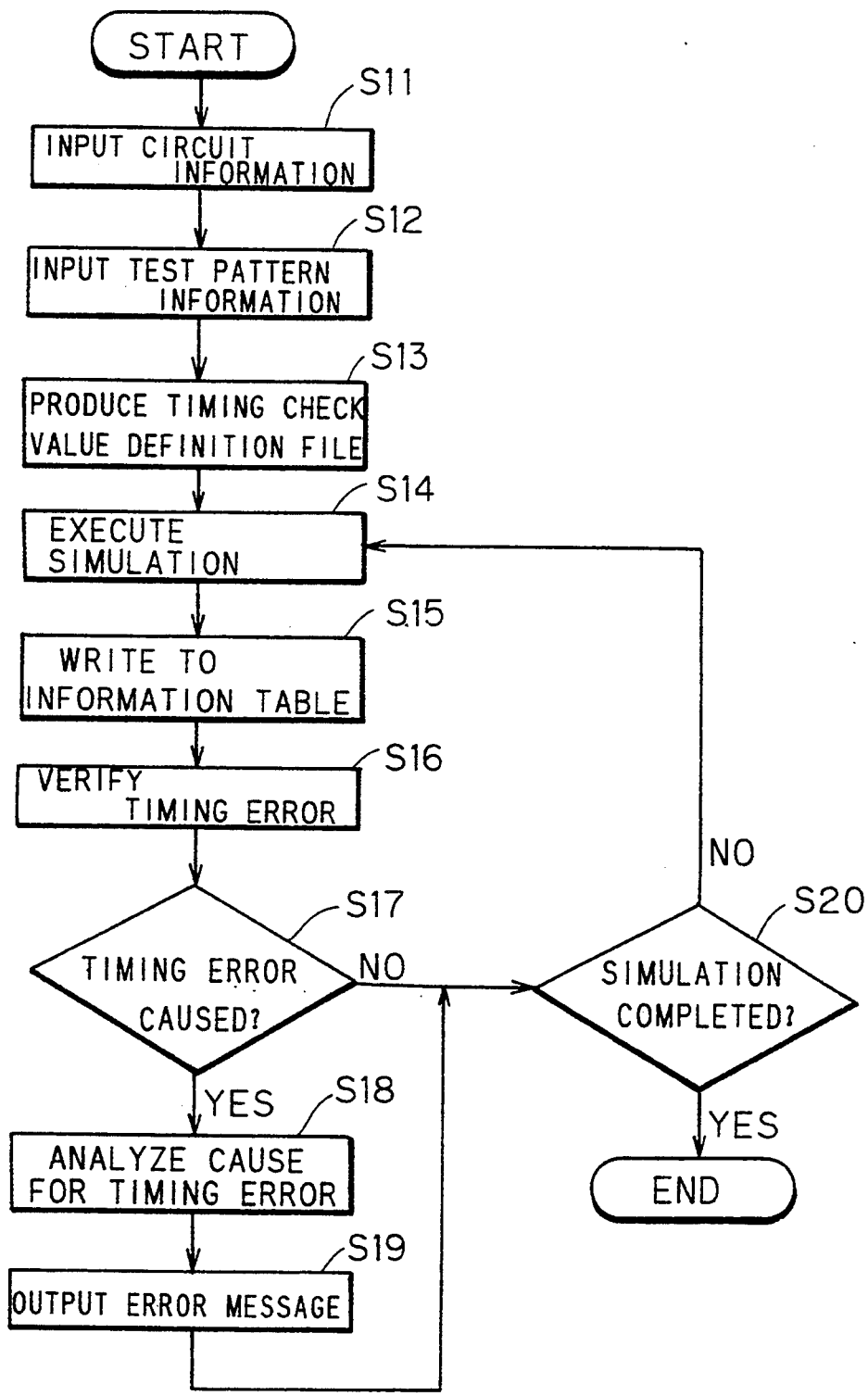
FIG. 9 is a flow chart of a timing verification of the simulator of the first preferred embodiment.

Description will be given on the operation of the simulator. It is assumed, for example, that test pattern signals V1 to V5 shown in FIG. 7 are applied to the input terminals P1 to P5, respectively, in the circuit of FIG. 3. FIG. 8 shows information tables 10a1 and 10a2 for the NOR gate 32 and flip-flop 33, respectively. FIG. 9 is a flow chart of the operation of the simulator.

The circuit information 1 of FIG. 1 having the element connections in the circuit of FIG. 3 are inputted to the circuit information memory 2, in the step S11. The simulation execution/control means 6 receives the test pattern information such as the test pattern signals V1 to V5 of FIG. 7 in the step S12.

In the step S13, the timing check value definition file producing means 12 produces the timing check value definition file 7 in which the timing error types and check values are independently set for each element as shown in FIGS. 4 and 5 as a function of the simulation condition information 3 and timing check condition information 5, to output the timing check value definition file 7 to the simulation execution/control means 6.

The simulation execution/control means 6, when activated in the step S14, starts the logic operation simulation of the circuit. The test pattern signals V1 to V5 of FIG. 7 are applied to the input terminals P1 to P5, respectively, so that the operation simulation of the elements 31 to 33 is carried out. In the simulation, the information table producing means 8 writes a new data to the information tables 10a each time an event for the elements 31 to 33 is produced.

As preparation for description of an example of the information tables 10a, the timing chart of FIG. 7 will be now described. The test pattern signal V4 and V5 of FIG. 7 are applied to the NOR gate 32 of FIG. 3. When V4="L" as shown in FIG. 7, a delayed and inverted value of the signal V5 appears as a signal VT at the output of the element 32.

It is assumed that a delay time $\Delta t_r$ for the rising of the input signal is longer than a delay time $\Delta t_f$ for the falling of the input signal in the NOR gate 32. A pulse width $\Delta t_0$ in the test pattern signal V5 becomes a pulse width $\Delta t_s$ in the signal VT at a node I of FIG. 3. When the pulse width $\Delta t_s$ is smaller than a threshold level $\Delta t_{th}$ (e.g., 0.6 ns) required as a normal T-input of the flip-flop 33, the pulse is a spike.

The level transitions of the test pattern signal V1 at times $t_{01}$, $t_{04}$ and $t_{05}$ are the transitions of the flip-flop 33 at a reset input. Since V2="L" and V3="H", the output of the NAND gate 31 is constantly at the "H" level.

A Q-output signal VQ of the flip-flop 33 falls to the "L" level at a time $t_4$ which is delayed by a time $\Delta t_D$ from the time $t_{04}$ at which the reset signal V1 is activated (to the "L" level). The Q-output signal VQ of the flip-flop 33 rises at a time $t'_3$ which is delayed by the time $\Delta t_D$ from a time $t_3$ at which the signal VT serving as a T-input is recognized to rise from the "L" level to the "H" level. In the practical circuit, since the "H" level pulse of the signal VT generated in the time interval between $t_2$ and $t_3$ is a spike, the "H" level is not recognized at the time $t_3$. The "H" level is, however, recognized in the simulator for proceeding the simulation. As an example, the table state of the information tables 10a at the time $t'_3$ of FIG. 7 will be described below.

Each of the information tables 10a (10a1 and 10a2) includes a first sub-table A1 and a second sub-table A2, as shown in FIG. 8. The same is true for an information table of the NAND gate 31 not shown. Each row of the first sub-table A1 includes the time (e g. $t_4$ and $t'_3$ in the table 10a2) at which the level transition has caused in the output signal of the corresponding element, the signal level ("H" or "L") and an identification information indicative of the terminal of the element in which the level transition has caused (e.g., "Q-output terminal" in the table 10a2).

The second sub-table A2 includes an information for indicating to which one of the input terminals P1 to P5 the test pattern signal having caused the level transition in the corresponding row of the first sub-table A1. The information includes, in each row, a terminal number indicative of the input terminal (one of the input terminals P1 to P5), a time information ($t_{04}$ and $t_{03}$) indicating at which time the level transition of the test pattern signal has caused the level transition of the elements, and the level transition ("H" or "L") of the test pattern signal at the time.

Each time the level transition occurs in the output signal of the element, the information in each row of the second sub-table A2 is transmitted from the information table of its preceding element. Each of the sub-tables A1 and A2 has a capacity for storing at least three rows (i.e., three events). In the example of FIG. 8, an information of the latest three events for the element is stored. When a new event is produced, the respective oldest informations included in the sub-tables A1 and A2 are eliminated to be renewed to the information corresponding to the new event.

In the step S16 of FIG. 9, the timing error detecting means 9a of FIG. 1 verifies the timing error as above described. For the purpose of verification and the like, the timing check primitive 9 which is capable of timing verification with respective independent contents as a function of the definition contents of the timing check value definition file 7 is connected to the inputs and outputs of the elements as conceptionally shown in FIG. 3. The input and output of only the flip-flop 33 are shown in FIG. 3 for convenience of illustration.

It is assumed that the verification is carried out as a function of the timing check condition information 5 of FIG. 1 and a spike of the signal VI is detected in the time interval between t2 and t3 of FIG. 7. In this case, "YES" is given in the step S18, and the timing error analyzing means 9b is activated in the step S19 to analyze the cause for the error.

Specifically, reference is made to the latest information of the information table 10a2 of the element 33 in which the timing error has been caused. It is found that the error at the time t'3 is related to the level transition of the test pattern signal V5 inputted to the input terminal P5 at the time $t = t_{03}$. It is hence found that the error results from either the test pattern signal V5 or the element (the NOR gate 32 in the example shown herein) in the circuit part between the input terminal P5 and the flip-flop 33.

The operations of the elements included in the circuit part are analyzed in a direction from the error element 33 to the input terminal P5 with reference to the information tables 10a for the respective elements. In the example, it is found from the contents of the information tables 10a1 and 10a2 that the error results from a difference between rising delay and falling delay in the NOR gate 32. When the difference in the NOR gate 32 is not the cause, the cause for the error is the test pattern signal V5 applied to the input terminal P5.

Only the three elements 31 to 33 are shown in FIG. 3. However, the practical circuit to be simulated includes an extremely large number of elements. Although the cause element is not necessarily specified directly by this operation, the targets of the cause analysis are at least narrowed down by recognizing the input terminal to which the test pattern signal related to the error is applied.

Figure 10:
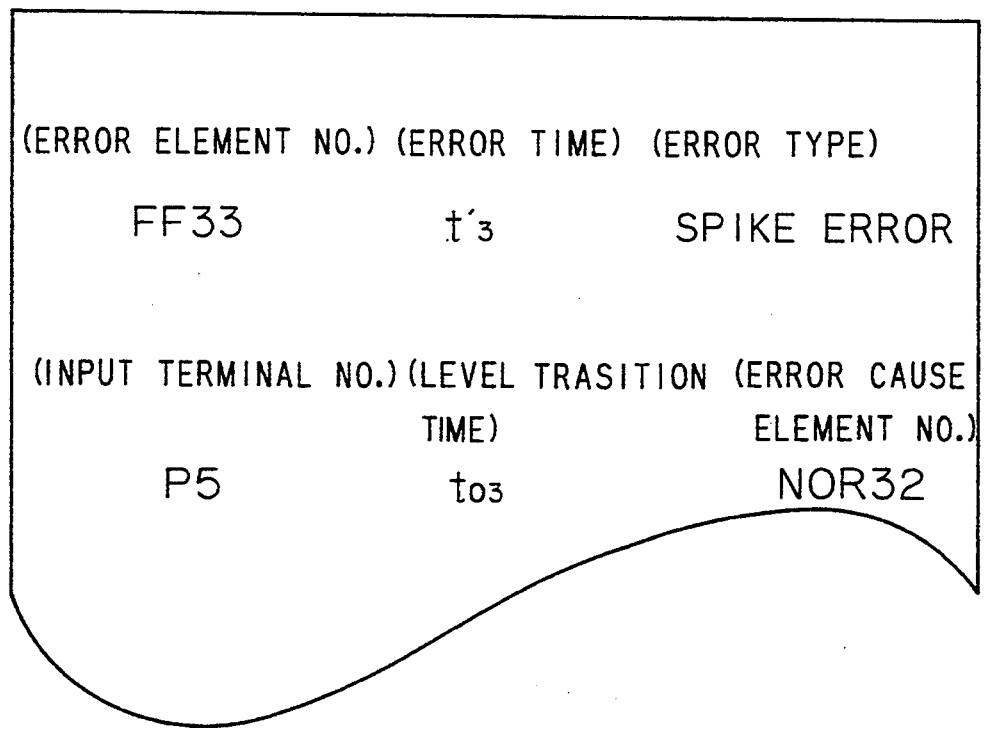
FIG. 10 illustrates an example of error message lists of the first preferred embodiment.

After the analysis, the error message producing means 11 of FIG. 1 is activated in the step S19 of FIG. 9. The error message list partially illustrated in FIG. 10 is printed out from the printer 26. The error message includes:

(1) the element number in which the error has been caused
(2) the time at which the error has been caused
(3) the type of error as informations for specifying the contents of the timing error. The error message also includes:
(4) the input terminal number related to the error
(5) the time at which the level transition having caused the error is produced in the input terminal related to the error
(6) the element number of the cause element, if specified which are listed therein as informations related to the cause for the error.

An operator, when reading the error message, can easily investigate the cause for the timing error in the circuit.

The timing error verification for the respective elements is carried out with independent contents as a function of the timing check value definition file 7, whereby the operator executing the simulation can carry out the desired timing error verification for the respective elements.

By defining the timing check value definition file 7 shown in FIG. 4, the timing verifications of a plurality of types are carried out at a time for the same element. By defining the timing check value definition file 7 shown in FIG. 5, the timing verifications of the same type with different check values are carried out at a time for the same element.

The operation of FIG. 9 is executed until the predetermined simulation is thoroughly completed. When the simulation is completed, the routine is terminated through the step S20.

In the first preferred embodiment, the informations (4) to (6) related to the cause for the error are listed in the error message list. When the error message list includes at least the information (4) (or the information specifying the test pattern related to the error among the plurality of input test patterns), the target range of the error cause investigation is narrowed down considerably. Although the error message list preferably includes all of the informations (4) to (6), it may include only the information (4).

The timing check primitive 9 is connected to the flip-flop in the first preferred embodiment. It is also effective to connect the timing check primitive to a latch, a counter and a memory element. When a change occurs in the output terminals P6 and P7, the input terminal providing the input signal in which the change occurs may be discriminated to calculate a path delay to the output terminals P6 and P7, by using the information tables 10a.

Figure 11:
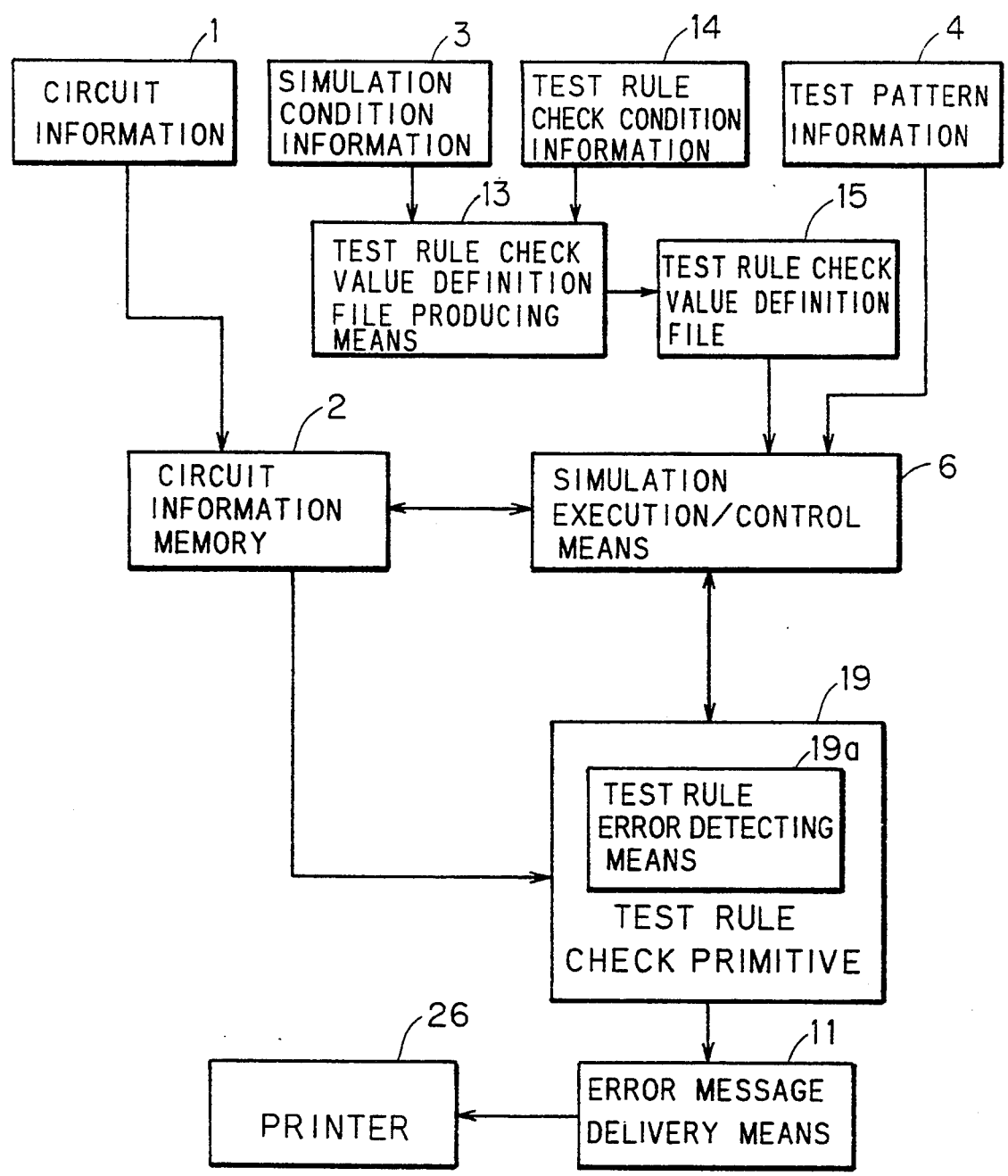
FIG. 11 is a block diagram of the simulator according to a second preferred embodiment of the present invention.

FIG. 11 is a block diagram showing a functional construction of the simulator according to a second preferred embodiment of the present invention.

The circuit information 1 having the element connections in the circuit to be simulated is inputted to the circuit information memory 2 from the exterior of the simulator.

The simulation condition information 3 specifying the parts of the circuit which are to be simulated and a test rule check condition information 14 specifying the contents of the test rule error verification of the input and output signals of the respective elements are applied to a test rule check value definition file producing means 13. The test rule check value definition file producing means 13 produces a test rule check value definition file 15 described below in detail as a function of the simulation condition information 3 and test rule check condition information 14.

The test rule check value definition file 15 and the test pattern information of the input signals to be applied to the input terminals of the circuit are given to the simulation execution/control means 6.

The simulation execution situations of the simulation execution/control means 6 are constantly given to a test rule check primitive 19.

A test rule error detecting means 19a included in the test rule check primitive 19 recognizes, from the simulation execution situations of the simulation execution/control means 6, the input and output signal level changes of the elements provided from the signal level changes of a signal line between the elements, to verify the test rule errors with independent contents for each element as a function of the contents of the test rule check value definition file 15.

The test rule error verifications are of the following types:

Icc leak check practicability test: extracting a period in which the whole circuit is static (without changes of H to L and L to H) to judge whether or not the Icc leak check is practicable;

DC test: testing whether or not there is a signal level change to H or L (including a high impedance state where the output terminals also serves as the input terminals) at an output pin to be measured;

Bus conflict test: testing whether or not an indefinite value (X) is provided by bus conflict;

Output buffer simultaneous change number test: testing whether or not the number of simultaneously changing signals among a plurality of signals connected to the output pins is within a limit; and Tests whether or not the number of waveforms, a waveform type, a dead zone (a time interval in which no signal level change is permitted), a clock width, a frequency width and the number of pins are within specified ranges, respectively.

FIGS. 12 to 16 illustrate parts of the contents of the test rule check value definition file 15. The test rule check value definition file 15 includes at least test rule check element names, test rule error types (check items) and check values.

Figures 16, 17:
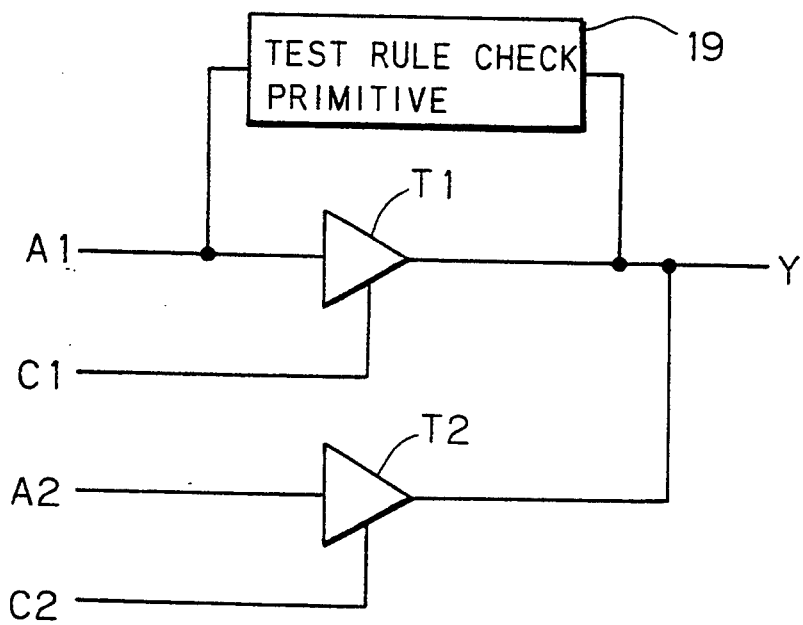
Figure 18:
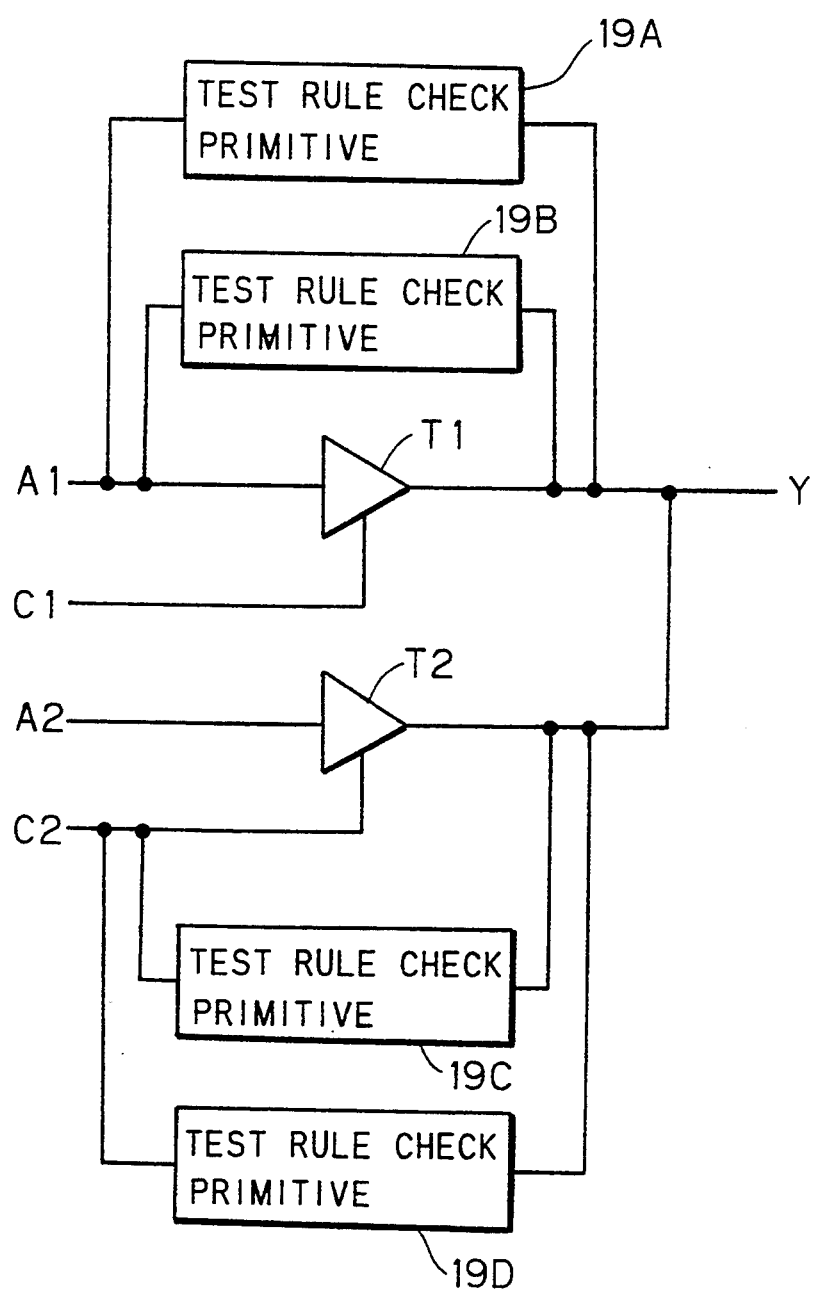
Figure 19:
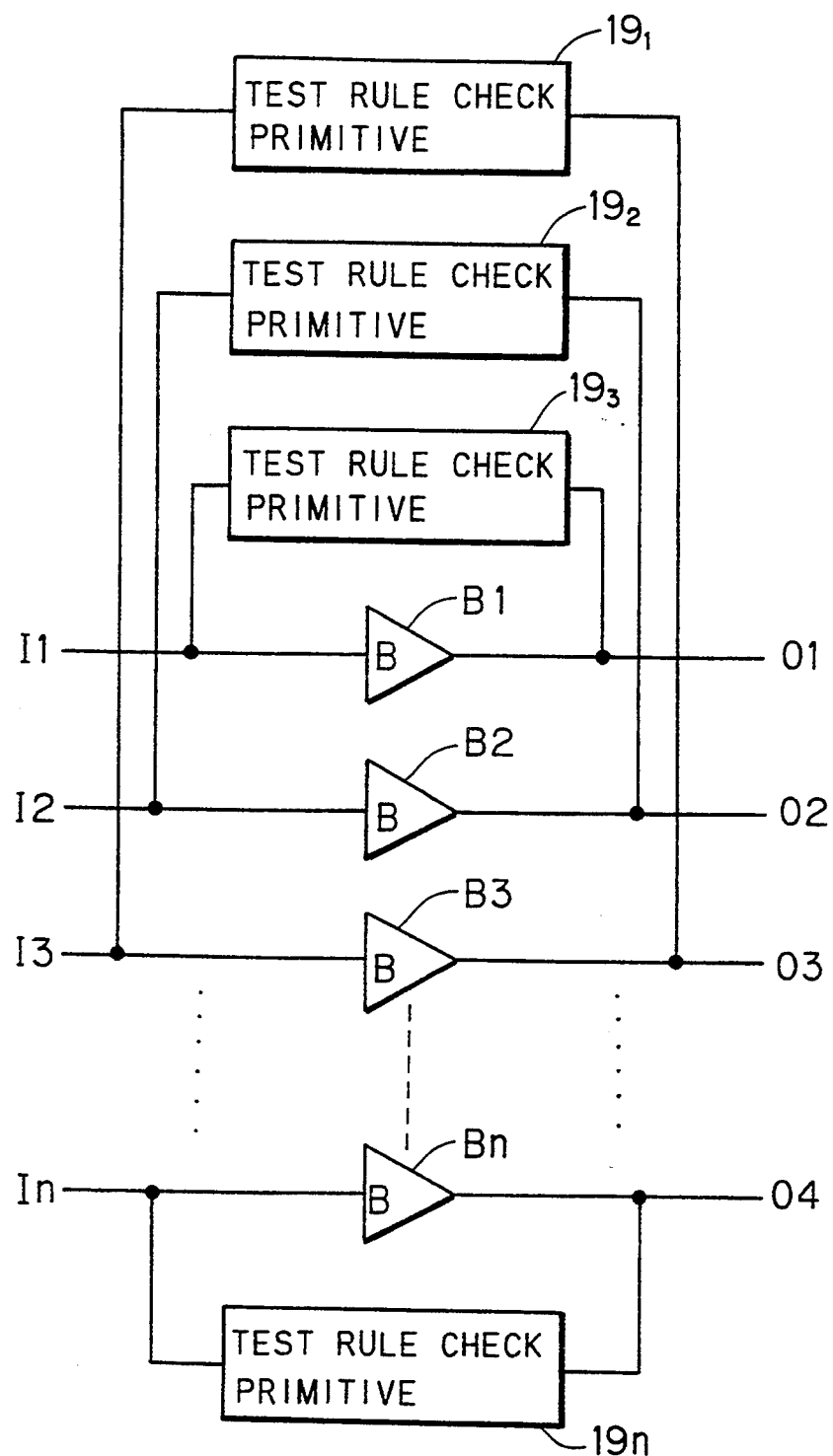

FIGS. 17, 18 and 19 are circuit diagrams showing the test rule check primitives 19 provided in corresponding relation to the test rule check value definition files 15 having the contents of FIGS. 12, 14 (or 15) and 16, respectively.

Since the test rule check value definition file 15 of FIG. 12 includes the check item of the test rule for a try state buffer T1, the test rule check primitive 19 is connected to the input and output of the try state buffer T1 as shown in FIG. 17.

Since the test rule check value definition files 15 of FIGS. 14 and 15 include respective two check items of the test rule for tri-state buffers T1 and T2, there ape provided four test rule check primitives 19A to 19D, the two primitives 19A and 19B being connected to the input and output of the tri-state buffer T1, the two primitives 19C and 19D being connected to the input and output of the tri-state buffer T2. When the tri-state buffer T1 (or T2) is defined twice in the test rule check value definition file 15, two test rule check primitives 19A and 19B (or 19C and 19D) can be produced for the single tri-state buffer T1 (or T2).

Since the test rule check value definition file 15 of FIG. 16 includes the same check item of the test rule for n-number of output buffers B1 to Bn, test rule check primitives $19_1$ to $19_n$ are connected to the inputs and outputs of the output buffers B1 to Bn, as shown in FIG. 19. The test rule check primitives are connected only to the outputs of the elements, in some cases, depending on the contents of the test rule verification.

By defining the test rule check value definition file 15 in this manner, the test rule error types and check values are set independently for the different tri-state buffers T1 and T2 and for the different output buffers B1 to Bn.

The definition of the contents of the test rule check value definition file 15 shown in FIG. 14 affords the simultaneous execution of the dead zone test of the tri-state buffer T1 by the test rule check primitive 19A of FIG. 18, the Icc leak test of the tri-state buffer T1 by the test rule check primitive 19B, the dead zone test of the tri-state buffer T2 by the test rule check primitive 19C and the Icc leak test of the tri-state buffer T2 by the test rule check primitive 19D.

The definition of the contents of the test rule check value definition file 15 shown in FIG. 15 affords the simultaneous execution of the dead zone test error verification of the tri-state buffer T1 with the check values of 10 and 9 (ns) by the test rule check primitives 19A and 19B and the dead zone test error verification of the tri-state buffer T1 with the check values of 7 and 6 (ns) by the test rule check primitives 19C and 19D.

The test rule error detecting means 19a, on detection of the test rule error, outputs the test rule error types and the error elements in the form of the error message to the error message delivery means 11.

Figure 20:
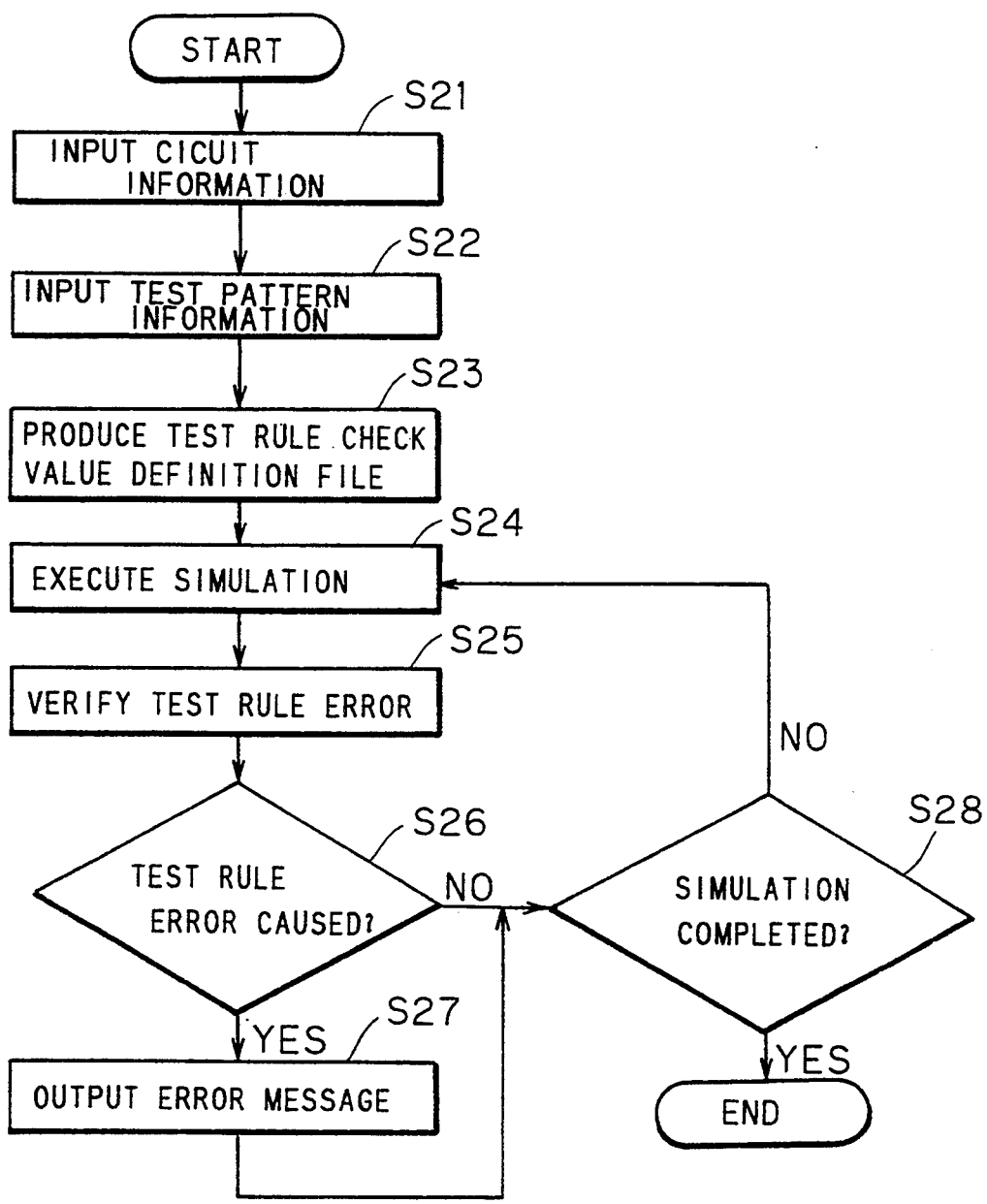
FIG. 20 is a flow chart of a test rule error verification of the simulator of the second preferred embodiment.

FIG. 20 is a flow chart of the operation of the simulator of the second preferred embodiment.

Initially, the circuit information 1 of FIG. 11 having the element connections in the circuit are inputted to the circuit information memory 2, in the step S21. The test pattern information is inputted to the simulation execution/control means 6 in the step S22.

In the step S23, the test rule check value definition file producing means 13 produces the test rule check value definition file 15 in which the test rule error types and check values are independently set for each element as shown in FIGS. 12 to 16 as a function of the simulation condition information 3 and test rule check condition information 14. The test rule check value definition file 15 is outputted to the simulation execution/control means 6.

The simulation execution/control means 6, when activated in the step S24, starts the logic operation simulation of the circuit.

In the step S25, the test rule check primitive 19 is connected to the output (and input) of the element. The test rule error verification is carried out as a function of the contents of the test rule check value definition file 15 by means of the test rule error detecting means 19a of FIG. 11.

Figure 21:
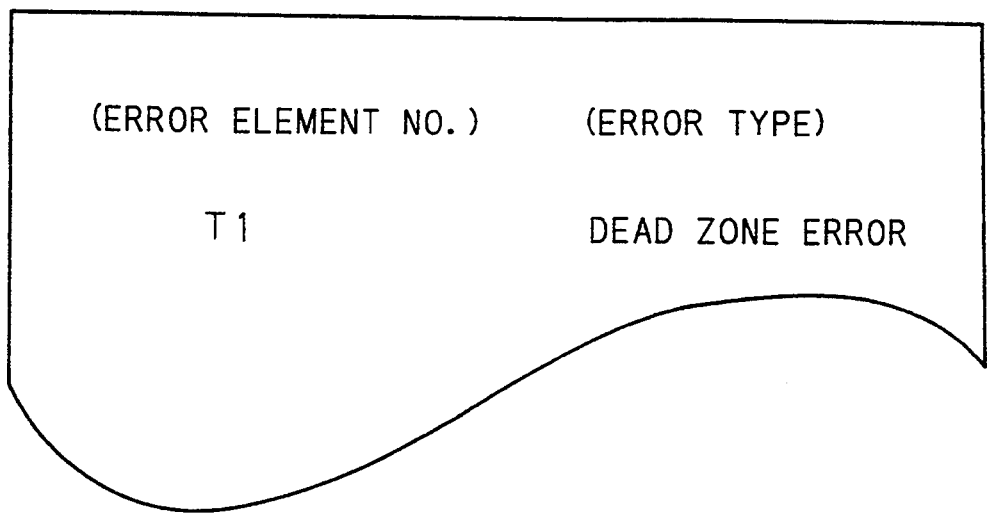
FIG. 21 illustrates an example of the error message lists of the second preferred embodiment.
Figure 22:
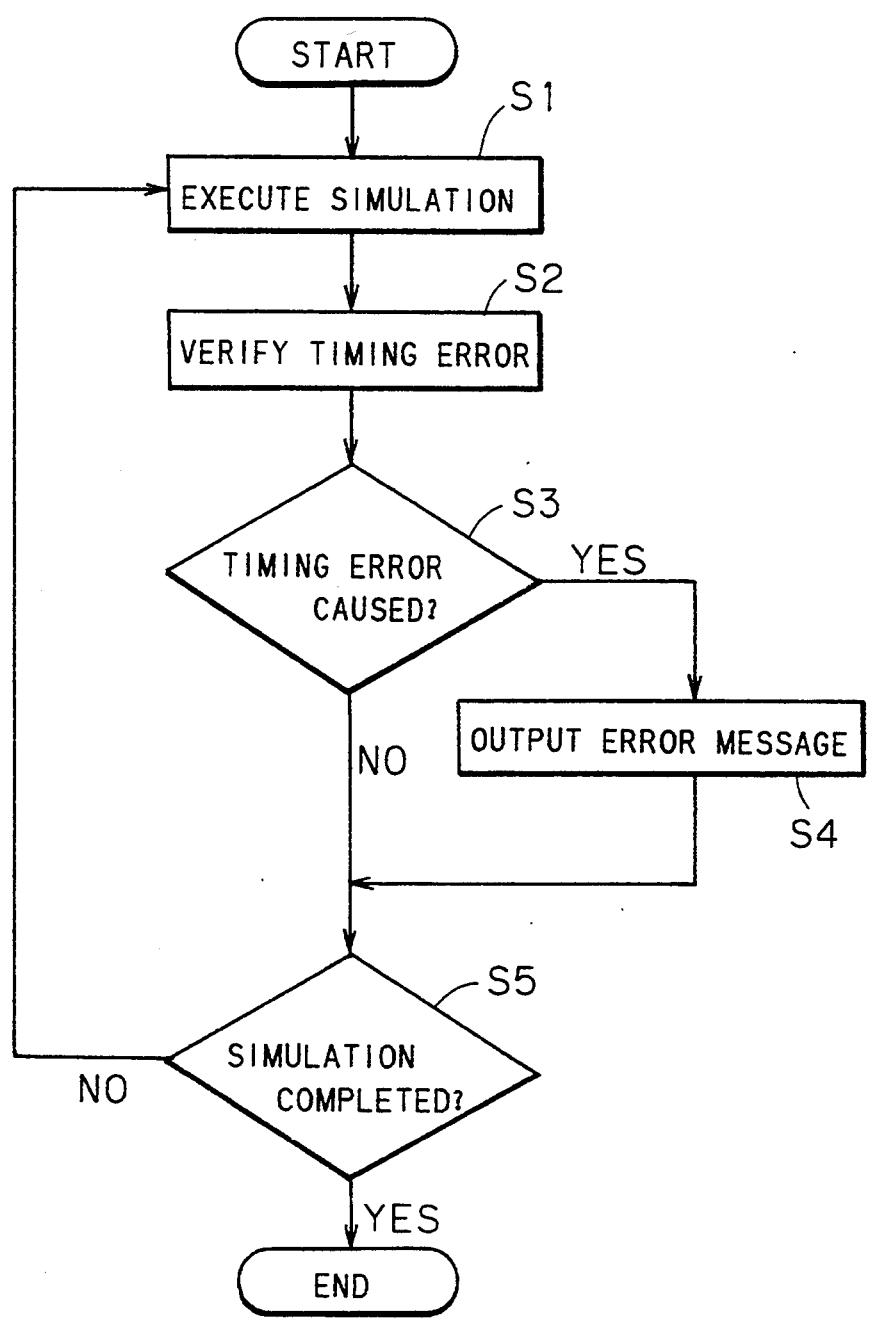
FIG. 22 is a flow chart of the timing verification of a conventional simulator.
Figure 23:
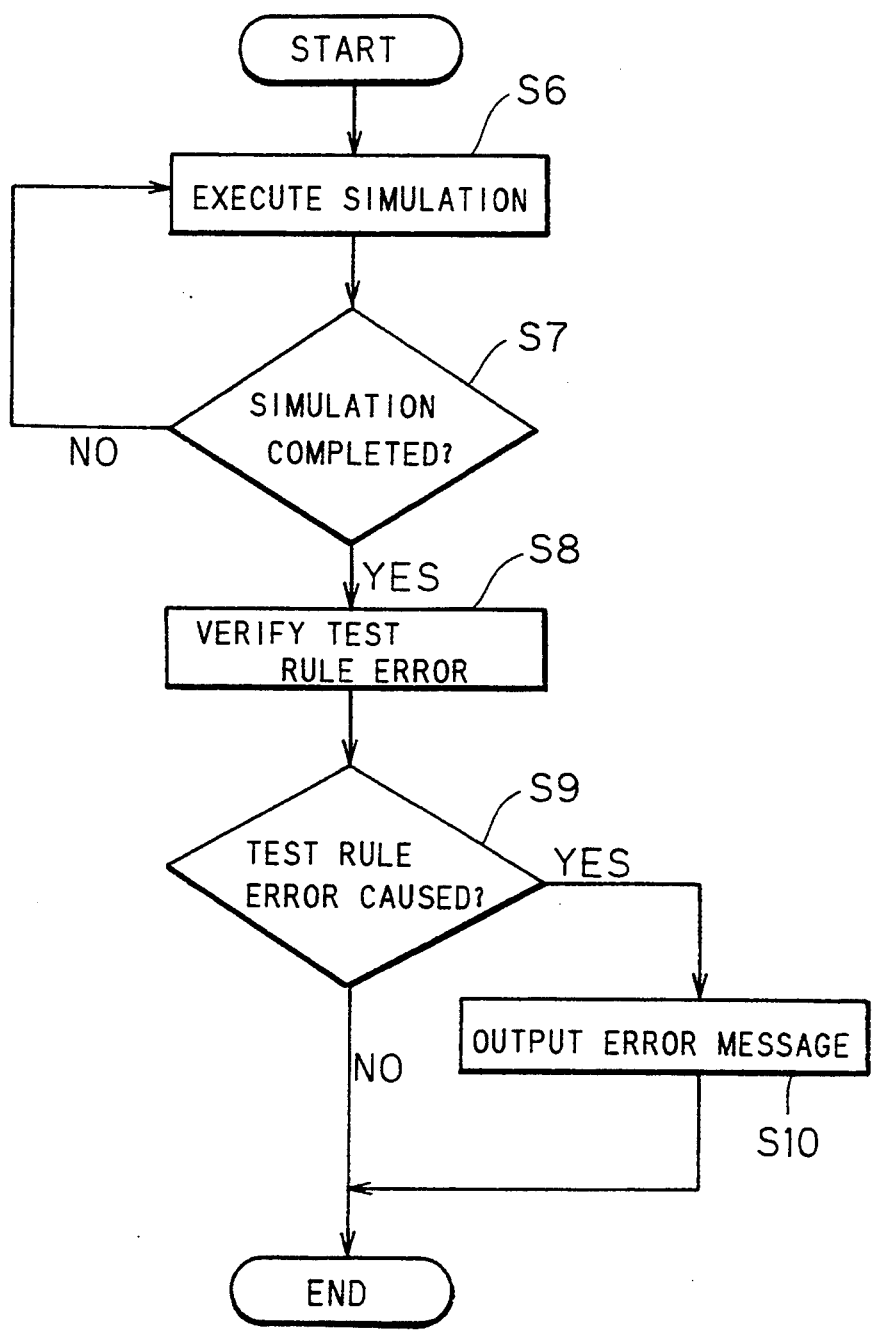
FIG. 23 is a flow chart of the test rule verification of the conventional simulator.

When the test rule error is detected in the step S26, the error message producing means 11 of FIG. 11 is activated, so that the printer 26 outputs the error message list partially illustrated in FIG. 21. The error message includes:

(1) the element number in which the error has been caused
(2) the type of error as an information for specifying the contents of the test rule error.

The test rule error verification for the respective elements is carried out with the independent contents as a function of the test rule check value definition file 15, whereby the operator executing the simulation can carry out the desired test rule error verification for the respective elements.

The test rule error verifications of a plurality of types are carried out at a time for the same element by defining the test rule check value definition file 15 shown in FIGS. 14 and 15. The test rule error verifications of the same type with different check values are carried out at a time for the same element by defining the test rule check value definition file 15 shown in FIG. 15.

The test rule check primitives 19 are connected to the tri-state buffers and output buffers in the second preferred embodiment. It is also effective to connect the test rule check primitives to a latch, a counter and a memory element.

A simulator is applicable which simultaneously executes the timing error verification of the first preferred embodiment and the test rule error verification of the second preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. The simulator for simulating an operation of an object circuit having interconnected electronic elements while detecting a timing error in respective operations of said electronic elements, wherein at least one of said electronic elements is a delay element, and said object circuit has a plurality of input terminals to which a given plurality of test pattern signals are applied, respectively, said simulator comprising:
    (a) memory means having storage areas which are assigned to said electronic elements, respectively;
    (b) means for providing a timing check definition file specifying contents of said timing errors for said electronic elements of said object circuit;
    (c) means for generating an electronic status equivalently representing a situation where said plurality of test pattern signals are applied to said plurality of input terminals of said object circuit, respectively to simulate an operation of said object circuit under said situation;
    (d) means coupled to said means (a) and (c) for being informed from said means (c) that a level transition is caused on one of outputs of said electronic elements and for writing in information an a storage area which is included in said storage areas and is assigned to an electronic element on whose output said level transition is caused, where said information includes a first component representing contents of said level transition and a second component identifying an input terminal of said object circuit to which a test pattern signal causing said level transition is applied;
    (e) means coupled to said means (b) and (c) for detecting a timing error on respective inputs and outputs of said electronic elements on the basis of said timing check definition file in a simulation executed by said means (c);
    (f) means coupled to said means (a) and (c) for referring to said information written in a storage area which is included in said storage areas and is assigned to an electronic element at which said timing error is detected, to identify a test pattern signal which is included in said plurality of test pattern signals and has relation to said timing error, and
    (g) means coupled to said means (f) for outputting an error message including a first data representing contents of said timing error and a second data identifying said test pattern signal having relation to said timing error.

2. The simulator of claim 1, further comprising:
    (h) means for continuing said simulation in said means (c) regardless of whether said timing error is detected or not until a simulation program which is previously prepared is completed.

3. The simulator of claim 1, wherein
said means (d) identifies said test pattern signal having relation to said timing error through identifying an input terminal to which said test pattern signal having relation to said timing error is applied.

4. A circuit simulator of claim 3, wherein
said information further includes a third component representing a time when said level transition is detected.

5. The simulator of claim 4, wherein
said information further includes a fourth component identifying contents of a level change in said test pattern signal having relation to said timing error.

6. The simulator of claim 5, wherein
said information further includes a fifth component identifying a time when said level change is caused.

7. The simulator of claim 6, wherein
said error message further includes a third data identifying an electronic element in which said timing error is detected.

8. The simulator of claim 7, wherein
said error message further includes a fourth data identifying said time of said level change in said test pattern signal having relation to said timing error.

9. The simulator of claim 8, wherein
said error message further includes a fifth data representing a time when said timing error is detected.

10. The simulator of claim 1, wherein
each of said storage areas is a table area having at least three storage regions each of which is capable to store said information.

11. The simulator of claim 10, wherein
said object circuit is a logic circuit.

12. The simulator of claim 1, wherein said timing check definition file includes at least one timing check information having a timing check object element, a timing error type for said timing check object element and a check value as one unit.

13. The simulator of claim 12,
wherein said timing check information is capable of storing said timing error types in plurality, and
wherein said means (e), where said timing check information has said plurality of timing error types, sequentially detects said timing errors for said timing check object element with said plurality of timing error types stored in said timing check information.

14. The simulator of claim 12,
wherein said timing check informations in plurality are permitted to be defined for the same timing check object element, and wherein said means (e), where said plurality of timing check informations have the same timing check object element, simultaneously detects said timing errors for said timing check object element with said timing error types and said check values stored in said timing check informations.

15. The simulator for simulating an operation of an object circuit having interconnected electronic elements while detecting a test rule error in respective operations of said electronic elements and said object circuit has a plurality of input terminals to which a given plurality of test pattern signals are applied, respectively, said simulator comprising:
   (i) means for providing a test rule definition file specifying contents of said test rule errors for said electronic elements of said object circuit;
   (j) means for generating an electronic status equivalently representing a situation where said plurality of test pattern signals are applied to said plurality of input terminals of said object circuit, respectively to simulate an operation of said object circuit under said situation;
   (k) means for detecting a test rule error on respective inputs and outputs of said electronic elements on the basis of said test rule definition file in a simulation executed by said means (j); and
   (l) means for outputting an error message including a first data representing electronic elements detected in said test rule error and a second data representing contents of said test rule error.

16. The simulator of claim 15, further comprising:
   (m) means for continuing said simulation in said means (j) regardless of whether said test rule error is detected or not until a simulation program which is previously prepared is completed.

17. The simulator of claim 16, wherein said object circuit is a logic circuit.

18. The simulator of claim 15, wherein said test rule check definition file includes at least one test rule check information having a test rule check object element, a test rule error type for said test rule check object element and a check value as one unit.

19. The simulator of claim 18,
   wherein said test rule check information is capable of storing said test rule error types in plurality, and
   wherein said means (k), where said test rule check information has said plurality of test rule error types, sequentially detects said test rule errors for said test rule check object element with said plurality of test rule error types stored in said test rule check information.

20. The simulator of claim 18,
   wherein said test rule check informations in plurality are permitted to be defined for the same test rule check object element, and
   wherein said means (k), where said plurality of test rule check informations have the same test rule check object element, simultaneously detects said test rule errors for said test rule check object element with said test rule error types and said check values stored in said test rule check informations.

* * * * *